United States Patent
Cao et al.

(10) Patent No.: US 11,691,909 B2
(45) Date of Patent: Jul. 4, 2023

(54) TEXTURED GLASS FOR LIGHT EXTRACTION ENHANCEMENT OF OLED LIGHTING

(71) Applicant: CORNING INCORPORATED, Corning, NY (US)

(72) Inventors: Xinyu Cao, Shanghai (CN); Haixing Chen, Shanghai (CN); Ling Chen, Shanghai (CN); Chenglong Dai, Shanghai (CN); Kwang je Woo, Asan-si (KR); Jianqiang Zhu, Shanghai (CN)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 16/465,259

(22) PCT Filed: Nov. 30, 2017

(86) PCT No.: PCT/US2017/063878
§ 371 (c)(1),
(2) Date: May 30, 2019

(87) PCT Pub. No.: WO2018/102512
PCT Pub. Date: Jun. 7, 2018

(65) Prior Publication Data
US 2019/0345056 A1    Nov. 14, 2019

Related U.S. Application Data

(60) Provisional application No. 62/428,088, filed on Nov. 30, 2016.

(51) Int. Cl.
C03C 15/00 (2006.01)
H10K 50/858 (2023.01)

(52) U.S. Cl.
CPC ........... *C03C 15/00* (2013.01); *H10K 50/858* (2023.02); *C03C 2204/08* (2013.01)

(58) Field of Classification Search
CPC .. C03C 15/00; C03C 2204/08; C03C 2218/34
See application file for complete search history.

(56) References Cited

U.S. PATENT DOCUMENTS

2008/0095997 A1* 4/2008 Chiang .................... G02B 1/18
428/522
2011/0062849 A1* 3/2011 Carlson ................... C03C 15/00
428/141

(Continued)

FOREIGN PATENT DOCUMENTS

CN 102623647 A 8/2012
CN 203013800 U 6/2013

(Continued)

OTHER PUBLICATIONS

Wikipedia, "Surface Roughness" via https://en.wikipedia.org/wiki/Surface_roughness ; pp. 1-9; (Year: 2021).*

(Continued)

*Primary Examiner* — Bihn X Tran (57) ABSTRACT

A textured glass substrate along with articles comprising a textured glass substrate and methods of making are provided. The substrates retain the mechanical and optical properties of the untextured glass, while the process provides a reliable and low cost, easy scale up method. The resulting glass substrates are of particular use for light extraction in organic light emitting diode structures.

11 Claims, 5 Drawing Sheets

(56) References Cited

U.S. PATENT DOCUMENTS

| | | | |
|---|---|---|---|
| 2012/0112224 A1 | 5/2012 | Le Bellac et al. | |
| 2012/0134025 A1 | 5/2012 | Hart | |
| 2012/0187367 A1* | 7/2012 | Modi | G02B 5/206 257/13 |
| 2013/0052414 A1* | 2/2013 | Dobbins | C03C 19/00 65/44 |
| 2015/0131156 A1* | 5/2015 | Borrelli | G02B 5/0278 359/599 |
| 2015/0179979 A1 | 6/2015 | Lee et al. | |
| 2017/0207401 A1* | 7/2017 | Guimard | H01L 51/5268 |
| 2017/0285227 A1 | 10/2017 | Chen et al. | |
| 2018/0158879 A1* | 6/2018 | Kim | H01L 51/5237 |

FOREIGN PATENT DOCUMENTS

| | | | |
|---|---|---|---|
| CN | 104330842 A | 2/2015 | |
| CN | 104766927 A | 7/2015 | |
| WO | WO-2008123833 A1 * | 10/2008 | ......... H01L 51/5281 |
| WO | 2014189775 A1 | 11/2014 | |
| WO | WO-2015053529 A1 * | 4/2015 | ............. C03B 23/20 |
| WO | 2016069113 A1 | 5/2016 | |

OTHER PUBLICATIONS

Hong et al; "Review Paper: Recent Developments in Light Extraction Technologies of Organic Light Emitting Diodes" ; Electronic Material Letters, vol. 7, No. 2 (2011), pp. 77-91.

International Search Report and Written Opinion of the International Searching Authority; PCT/US2017/063878; dated Mar. 15, 2018; European Patent Office.

Chinese Patent Application No. 201780079692.5, Office Action dated Jan. 19, 2022, 16 pages (8 pages of English Translation and 8 pages of original document), Chinese Patent Office.

* cited by examiner

FIG. 1A normal glass

FIG. 1B textured glass

TEXTURED GLASS FOR LIGHT EXTRACTION ENHANCEMENT OF OLED LIGHTING

This application claims the benefit of priority under 35 U.S.C. § 371 of International Application No. PCT/US2017/063878, filed on Nov. 30, 2017, which claims the benefit of priority under U.S.C. § 119 of U.S. Provisional Application Ser. No. 62/428,088, filed on Nov. 30, 2016, the content both of which are relied upon and incorporated herein by reference in their entirety.

FIELD

The following description relates to textured glass substrates for improved light extraction in organic light emitting diodes along with methods for processing a glass substrate having a textured surface.

BACKGROUND

High efficiency organic light-emitting diodes (OLEDs) have been subjects of intensive research in recent years due to their potential applications in display and lighting. Theoretically, 100% of the internal quantum efficiency of OLEDs can be achieved by using phosphorescent emitters that harvest both of the singlet and triplet excitations emission. However, realistically, only ~20% of the internal emission can be out-coupled while the remaining ~80% of internal emission are lost mainly due to total internal reflection at ITO/glass, glass/air interface and surface plasmon at organic/metal interface. Many approaches to enhance the light extraction of OLED lighting have been proposed such as roughening or changing the surface of the substrate by sandblasting, adding scattering films or particles, dielectric metal layers, patterned ITO electrodes, nano-structured layers, metal grating structures as well as the micro-lens arrays to enhance the out-coupling efficiency of OLED lighting. However, each of these approaches has its own disadvantageous, including the reliability of coating layer, complex processes for patterning, strength reduction of substrate, additional material costs, and difficulty for scale-up.

In this disclosure, a new approach to enhancing external light extraction of OLEDs by roughening the surface of glass with etching cream (EC) process is disclosed along with articles having the improved features. This process provides the possibility to obtain the desired surface morphology in the glass substrate, which results in improved light scattering from the OLED by eliminating the total internal reflection (TIR) between the interface of ITO/glass and/or glass/air, thus enhancing the internal and external quantum efficiency of the OLED light. The EC process has been applied for roughening the surface of glass based on the principle of differentiated etching, which is a low cost, reliable process that can be scaled up to larger sizes or applied to curved or flexible glass. Moreover, the microstructure of textured surface of glass can be tuned easily by EC formulation and etching time to maximize the out-coupling efficiency of OLEDs.

SUMMARY

Described herein are glass substrates that have modified surface textures for improving light extraction in OLEDs along with processes for forming such glass substrates. The substrates are designed to be used alone or in combination with other light extraction features in OLED devices to improve the overall light output or efficiency of the OLED device. The processes used to form the modified substrates incorporate the use of an etching cream, making them useful in many applications.

In a first aspect, aspect (1), the disclosure provides an article comprising: a textured glass substrate having a first face, a second face and at least one edge; the first face comprising an approximately planar surface having a first surface roughness, $R_{a1}$, of less than 2 nm; and the second face comprising a textured surface having a second surface roughness, $R_{a2}$, of from 200 nm to 600 nm and a feature size, F, of from 2 µm to 20 µm. In an aspect (2), the disclosure provides the article of aspect (1), wherein the textured glass substrate has a reflective haze of 0.5 or lower as measured by ASTM D4039. In an aspect (3), the disclosure provides the article of aspect (1) or (2), wherein the textured glass substrate has a haze in transmission of greater than 80% as measure by ASTM D1003. In an aspect (4), the disclosure proved the article of any one of aspect (1)-(3), wherein the first surface roughness, $R_{a1}$, is less than 1 nm. In an aspect (5), the disclosure proved the article of any one of aspect (1)-(4), wherein the second surface roughness, $R_{a2}$, is from 400 to 540 nm. In an aspect (6), the disclosure proved the article of any one of aspect (1)-(5), wherein the feature size, F, is from 2 µm to 15 µm.

In an aspect (7), the disclosure provides a device comprising the article of any of claims 1-6, wherein the device further comprises a cathode, an anode, and at least one organic light emitting layer that is capable of emitting light. In an aspect (8), the disclosure provides the device of aspect (7), wherein the textured glass substrate provides an enhancement to light output from the organic light emitting layer of greater than 50% when compared to a second device identical to the device except that the second device substitutes a planar, non-textured glass substrate of identical composition and thickness in place of the textured glass substrate. In an aspect (9), the disclosure provides the device of aspect (7), wherein the external quantum efficiency of the device is 40% or greater. In an aspect (10), the disclosure provides the device of aspect (9), wherein the external quantum efficiency of the device is 60% or greater.

In an aspect (11), the disclosure provides a method of making an article of any of aspect (1)-(6), the method comprising: protecting at least a part of the first face of a glass sheet with a protective layer; coating the second face of the glass sheet with an etching cream comprising $NH_4HF_2$, $NH_4F$, $KNO_3$, $CUCl_2$, and HF; and removing the etching cream from the glass sheet. In an aspect (12), the disclosure provides the method of aspect (11), wherein the etching cream composition comprises 10-20 wt % $NH_4F$ and 10-20 wt % $NH_4HF_2$, 0-10 wt % $KNO_3$, and 1-25 wt % $CuCl_2$. In an aspect (13), the disclosure provides the method of aspect (12), wherein the etching cream composition further comprising 5-20 wt % $BaSO_4$ as filler, 1-10 wt % soluble starch, and 0-5 wt % polyacrylamide. In an aspect (14), the disclosure provides the method of any of aspects (11)-(13), wherein the method further comprises pre-cleaning the glass sheet in a solution of 9 wt % HF and 9 wt % HCl.

The first aspect may be provided alone or in combination with any one or more of the examples of the first aspect discussed above.

BRIEF DESCRIPTION OF THE DRAWINGS

The accompanying drawings are included to provide a further understanding of the description, and are incorporated in and constitute a part of this specification. The drawings are not necessarily to scale, and sizes of various elements may be distorted for clarity. The drawings illustrate one or more embodiment(s) and together with the description serve to explain the principles and operation of the embodiments.

FIG. 1A shows that when flat glass is used as the substrate, light at high incidence angles has an increased chance of being reflected back into the OLED due to the total internal reflection. Comparatively, FIG. 1B shows that more light can be extracted when a textured substrate is used because the texture reduces the angle of incidence for more light rays, increasing the amount of light that is emitted.

FIG. 7 is a process flow chart for the etch cream process of forming the textured light enhancement substrates. The glass substrate undergoes pre-cleaning by immersion into an acid and is then rinsed with a deionized water solution along with optional sonication. Once cleaned, the substrate is etched in the etching cream by dipping or spraying, in which the roughened surface of glass would be created. After the etch treatment, the textured glass undergoes a post cleaning to remove any residual etch cream or contaminants. After the post cleaning, the substrate is generally ready to be coated with additional layers for OLED fabrication.

DETAILED DESCRIPTION

The present invention will now be described more fully hereinafter with reference to the accompanying drawings in which example embodiments of the claimed invention are shown. Whenever possible, the same reference numerals are used throughout the drawings to refer to the same or like parts. However, the claimed invention may be embodied in many different forms and should not be construed as limited to the embodiments set forth herein. These example embodiments are provided so that this disclosure will be both thorough and complete, and will fully convey the scope of the claimed invention to those skilled in the art.

Figure 1A:
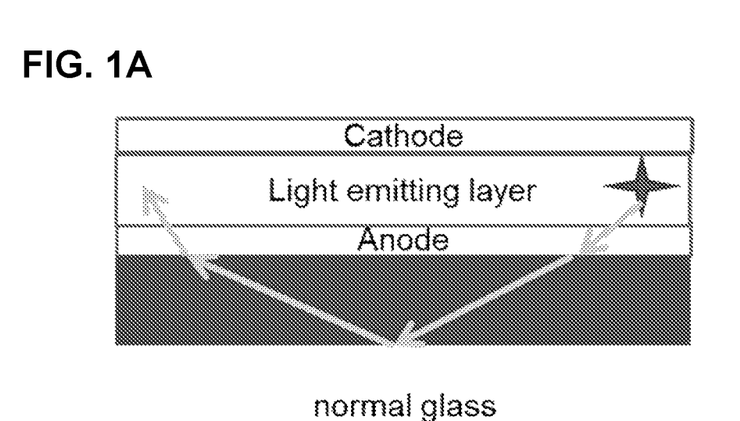
FIGS. 1A and 1B show a comparison of light emitted from an OLED device on a non-textured (FIG. 1A) and textured glass (FIG. 1B) substrate.
Figure 1B:
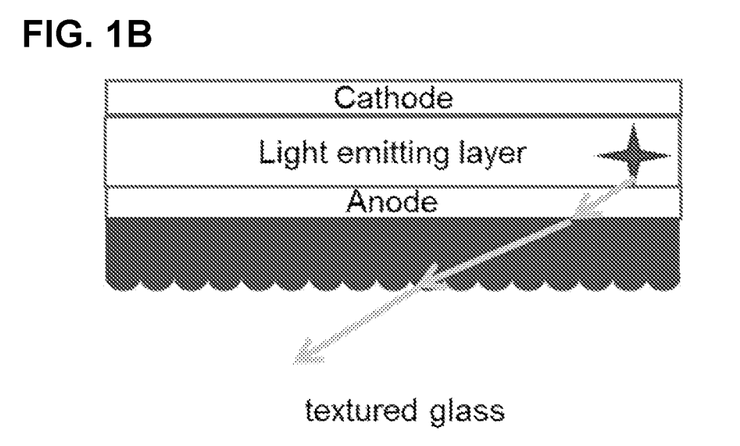

The challenge to improve the light efficiency of OLEDs is that the light loss caused by total internal reflection (TIR) within the device should be reduced as much as possible. The major loss of external quantum efficiency is the index mismatch in the interfaces between the various components within the device. For example, the one of the biggest losses occurs at the interface of the glass substrate (n~1.52) and air (n~1.0). FIG. 1A is a schematic showing a typical OLED device on a substrate having two planar surfaces. Light emitting from the organic layer at high incidence angles is reflected back at the glass-air interface. Comparatively, FIG. 1B shows that a textured surface at the glass-air interface provides improved incidence angles for more light beams, allowing for improved light extraction. There are several approaches to get the textured glass surface, such as sandblasting, nano-printing, micro-lens array and metal grating structure. However, most of them suffer from cost, complexity or control of the surface modification. There continues to be an unmet need for textured surfaces that meet the needs of the OLED industry.

Article

Described herein are substrates that are textured on at least one side, where the textured surface provides enhanced light extraction when the substrates are used in or in conjunction with OLED devices. FIG. 1B provides a schematic of an OLED device comprising an embodiment of a substrate described herein. The textured glass substrate comprises a planar layer adjacent the anode and a textured surface at the air-substrate interface. The change in surface angle relative to the OLED-emitted light, the increased surface area, and the random orientation of the surface all produce an increase in light extracted from the textured glass substrate when compared to the "normal" planar glass.

Embodiments described herein provide enhancements or improvements in external quantum efficiency of greater than 1.4×, 1.5×, 1.6×, 1.7×, or 1.8× or more. These values are obtained from comparing an OLED device formed on the textured glass substrate described herein and comparing it to an identical OLED device formed on the equivalent (same composition, thickness, etc.) glass substrate that hasn't been subjected to the texturing processes described below.

In some embodiments described herein, the OLED device on the textured glass substrate has an angle integrated external quantum efficiency of >40%, >45%, >50%, >55%, >60%, or >65%. The angle integrated external quantum efficiency is the numerical integration over the angles 0°, 15°, 30°, 45°, 60° and 70°, at which the luminance efficiency of OLED device was measured by the system utilizing the integrate sphere.

Figure 3:
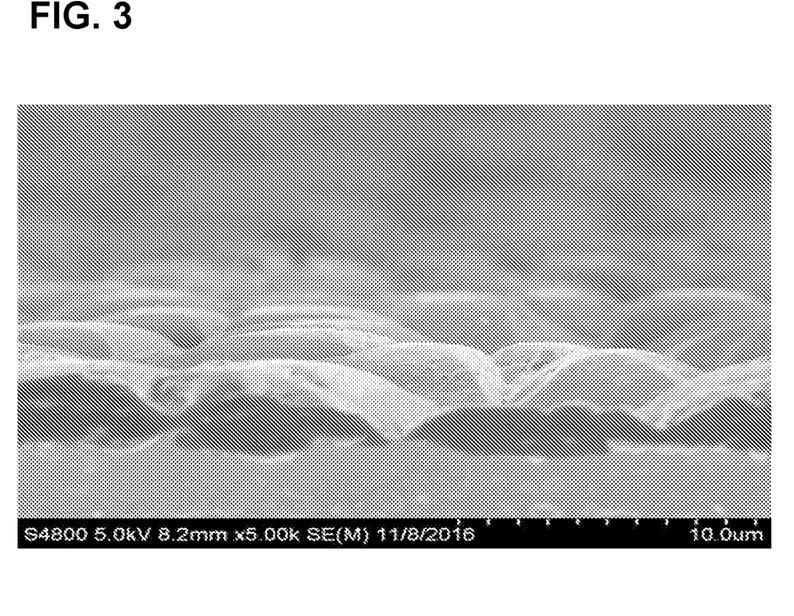
FIG. 3 is another scanning electron microscope image showing the surface morphology of a textured surface prepared by methods described herein. The length bar equates to 10 µm.
Figure 4:
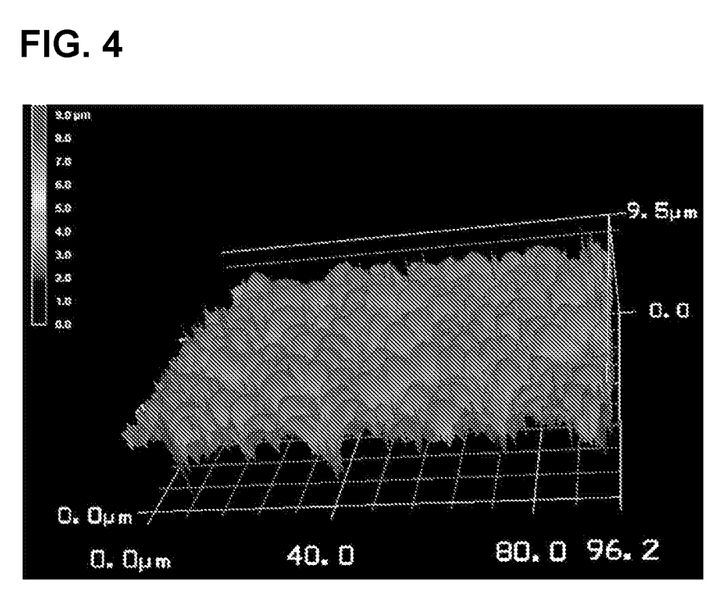
FIG. 4 is a color-enhanced, tilted image of surface morphology of textured glass by EC process observed via SEM.
Figure 5:
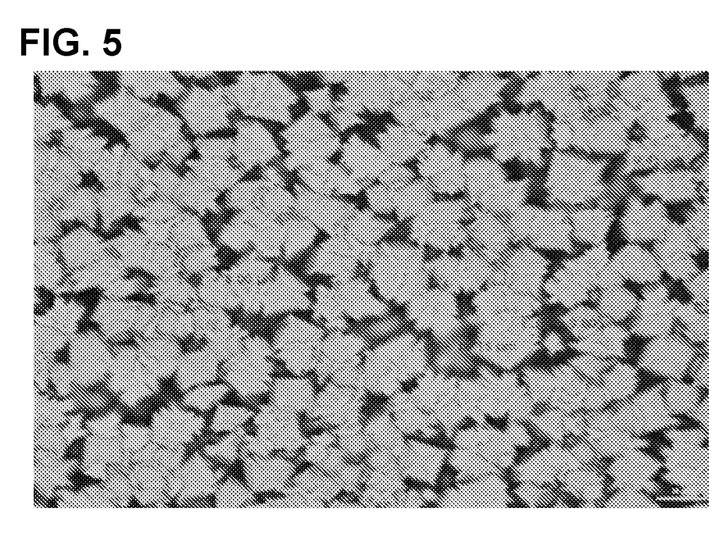
FIG. 5 is an optical micrograph showing the surface morphology of a textured glass substrate wherein the magnification is 1000×.

Now looking at the surface morphology in FIG. 3 and FIG. 4, the images shows a cross section of a textured substrate. The features on the substrate have a semicircular shape with feature sizes on the order of 2-20 µm in diameter and approximately 2-8 µm in height. FIG. 5 is a top-down view of a textured glass substrate via optical microscopy. The features shown in FIG. 5 are again on the order of 2-20 µm with an irregular pattern. The 3D topography of surface texture of the samples was then measured in the area 100×100 µm using a Keyence Confocal Laser Scanning Microscopy as showed in FIG. 6.

The substrate surface facing the OLED device is generally kept smooth to provide an even coating surface. In some embodiments, one or more light extraction layers may be coated onto the substrate. These light extraction layers can be of any suitable form, but are often in the form of particles of high or low refractive index in a matrix that is either similar to the ITO or organic layer, or of opposite refractive index to the particles (low index matrix/high index particles or vice versa). In some embodiments, one or more transparent conductive oxides are coated onto the substrate. In some embodiments, the OLED-facing substrate has a surface roughness of less than 2 nm, less than 1.5 nm, less than 1 nm, less than 0.75 nm, or less than 0.5 nm when measured via ASME B46.1 standards.

The substrate surface facing away from the OLED device is generally the textured face. It may be completely textured or textured in certain areas by use of a coating or laminate that protects areas of the glass that should remain untextured. The texturing of the face can be accomplished by any suitable method, but it has been found to be most cost effective and produce unexpected benefits when done via the etch cream processes described herein. In addition to the feature sizes described above, the textured surface can have an average surface roughness of from 200-800 nm, 250-700 nm, 300-600 nm, 400-550 nm, 450-525 nm, or 475-510 nm.

In some embodiments, the haze of the substrates is critical to the output efficiency. The substrates have both transmission and reflection haze factors. Transmission haze is the scattering of light (at an angle greater than 2.5° from normal (ASTM D1003)) when passing through the glass. In some embodiments, the transmission haze is from 60-98%, 70-98%, 80-98%, 90-98%, 80-96%, 90-95%, or greater than 80% or greater than 90%.

Alternatively, reflection haze is an optical phenomenon usually associated with high gloss surfaces where due to imperfections in the surface caused by microscopic structures or the reflection can appear milky or hazy reducing the quality of its overall appearance. In the embodiments described herein, the reflection haze is measured by ASTM D4039 standards. In some embodiments, the reflection haze is from 0.3-0.6, 0.35-0.55, 0.4-0.55, 0.45-0.55, or greater than 0.3, or greater than 0.4.

The overall transmission through the glass should be maximized given the constraints described herein. Embodiments can have transmission values of greater than 60%, greater than 65% or greater than 70% for a 0.4 mm thick glass substrate at 500 nm.

The textured glass substrate can be one of any number of compositions. The substrate may be of any suitable composition including alumino-silicate, boro-silicate, alumino-boro-silicate, and soda-lime-silicate, and either alkali-containing or alkali-free, depending upon their ultimate application. Additionally, the substrate may be made of one layer, as shown, or multiple layers (including multiple thin sheets) that are bonded together. Again, the glass substrate may be various types of glass, including, but not limited to, Gorilla® glass, Eagle XG® glass, Lotus™ glass, and soda-lime glass, or various types of thin flexible glass substrates, including, but not limited to, Willow™ glass Substrates can be any suitable size and thickness. For example substrates can be from 30 μm to 2 mm, 50 μm to 2 mm, 100 μm to 2 mm, 200 μm to 2 mm, 500 μm to 2 mm, 1 mm to 2 mm, 30 μm to 1 mm, 50 μm to 1 mm, 100 μm to 1 mm, 200 μm to 1 mm, 500 μm to 1 mm, 30 μm to 500 μm, 50 μm to 500 μm, 100 μm to 500 μm, 200 μm to 500 μm, 30 μm to 200 μm, 50 μm to 200 μm, or 100 μm to 200 μm.

Another aspect comprises articles incorporating the textured substrates described herein. Articles include organic light emitting diode (OLED) devices, that optionally include one or more additional light extraction features within or adjacent to the OLED device. The OLED may comprise a cathode, an anode (typically a transparent conductive oxide), one or more organic layers, as well as internal light extraction layers that may be in any of the above layers or adjacent to any of the layers. Example internal light extraction layers include nanospheres or nanoparticles or microparticles, voids, microlenses, etc. Materials can include silica, titania, niobium oxide, etc.

Figure 6:
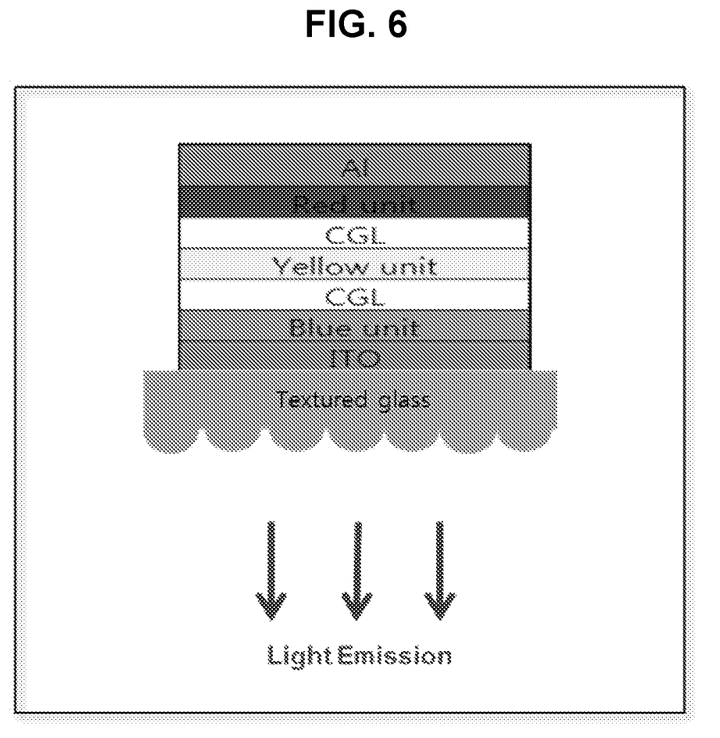
FIG. 6 is a diagram illustrating an example a fabricated white OLED ("WOLED") with a textured glass substrate, wherein the convex shape on the outer surface.

FIG. 6 provides an example embodiments of a white light OLED device that incorporates multiple OLED layers (red unit, yellow unit, blue unit) separated by charge generation layers (CGLs) and sandwiched between a cathode and anode to produce a white light output.

Process

Figure 7:
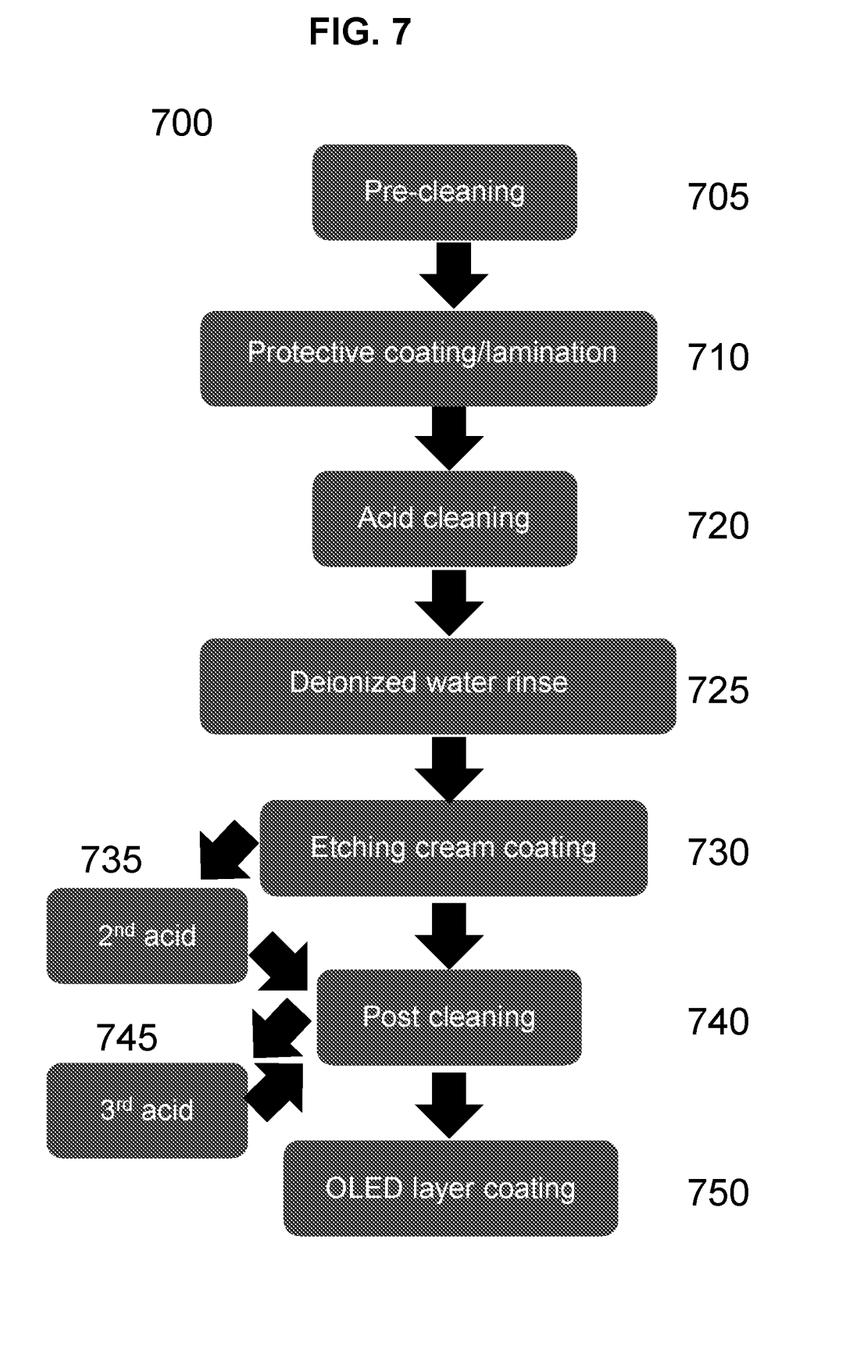

FIG. 7 is a flow diagram illustrating an example embodiment 700 of a method for making the textured substrates described herein. It is similar to that described in WO 2014/189775, herein incorporated by reference in its entirety. This method 700 is directed to roughening a glass surface using an etching cream, which contains a mixture of fluorine salts, insoluble salts, soluble salts, and mineral acid, and may be particularly useful when the glass to be roughened (either the flexible glass substrate 20 or the glass substrate) is a low ion soda lime glass, although it may be used on other glasses as well.

Referring to the example illustrated in FIG. 7, the glass substrate may be cleaned 705 to remove contaminants. Then, the glass substrate may be rinsed and placed into an ultrasonic bath with deionized water for further cleaning 705. After drying, the glass substrate may be laminated 710 with an anti-acid polyethylene to protect a mount area of the glass carrier. In some embodiments, the glass substrate may be immersed 720 in a diluted hydrofluoric acid and hydrochloric acid solution for a short period to remove a very thin surface layer of the glass substrate and to clean and activate the surface. This period may be within a range of 5 seconds to 10 seconds.

After rinsing 725, for example, in deionized water for 10 seconds, the glass substrate is exposed 730 to etching cream for a time period of from between 30 and 2400 seconds. In some embodiments, the etching powder used for the etching cream may be composed of 10-40 wt % of KF as a fluorine source, 10-40 wt % of KCL or $KNO_3$ as an additional salt, 5-20 wt % of $BaSO_4$ as filler, 1-10 wt % of starch, and 1-10 wt % of polyacrylamide. This powder may be dissolved in 20-50 wt % of concentrated HCl acid or a mixture of HCl acid and acetic acid to form the etching cream. Up to 20 wt % of water can be added if the slurry created by the dissolved powder is too thick. After dissolving, the etching cream can be kept at ambient conditions for 12 hours prior to use with manual agitation every 2-4 hours to reach chemical equilibrium.

An alternative etching cream containing $NH_4HF_2$, $NH_4F$, KCl, $BaSO_4$, and HCl can also be used. This etching cream may be particularly useful when Gorilla® Glass is used as a glass substrate, and includes the surface to be roughened to provide the release area. Further, an etching cream composed of 10-20 wt % of $NH_4F$, 10-20 wt % of $NH_4HF_2$, 0-10 wt % of $KNO_3$ as additional salt, 5-20 wt % of $BaSO_4$ as filler. 1-10 wt % of soluble starch, and 0-5 wt % of polyacrylamide can be used. The solids mentioned above can be combined with 36-38% concentrated HCl acid and prepared as stated above with respect to the etching cream being used for texturing the substrate. For this application, the method 700 may optionally include a second acid exposure 735 containing 15 wt % of $H_2SO_4$ and 5 wt % HCl after the exposure 730 to the etching cream for the required amount of time. Further, after the second acid exposure 735 and a deionized water rinse 540, an optional third acid exposure 745 containing 24 wt % HF and 45.5 wt % HCl may be conducted. After the third acid exposure, the substrate is again washed in a post cleaning step 740.

Other soluble metal ions can be added or used, such as $CaCl_2$, $Ca_2SO_4$, $MgCl_2$, $Mg_2SO_4$, $Mg(NO_3)_2$, $FeCl_3$, $Fe_2(SO_4)_3$, $Fe(NO_3)_3$, $CoCl_2$, $Co_2SO_4$, $Co(NO_3)_2$, $NiCl_2$, $Ni_2SO_4$, $Ni(NO_3)_2$, $ZnCl_2$, $Zn_2SO_4$, $Zn(NO_3)_2$, which may also generate the similar surface morphology for this kind application.

After the exposure 730 to the etching cream for the required amount of time, the glass substrate may be rinsed 740, for example, in deionized water. Afterwards, the lamination may be removed and the glass substrate may be thoroughly rinsed 740 to remove the remaining acid and etching cream on the surface. Once the surfaces has been thoroughly cleaned, the substrate can be utilized in the formation of OLED devices by additional coatings of transparent conductive oxides or light extraction layers as known in the art.

The roughness of the textured surface of the substrate can be controlled by the concentration of the etching cream and the time for which the glass substrate is exposed to the etching cream. Higher etching cream concentrations and longer etching cream processing times may lead to greater surface roughness. An increase in acid concentration or processing time also may lead to a rougher surface texture.

Texture uniformity may be normally satisfied for square shaped substrates after exposure to the above-referenced etching cream as a dip. Alternatively, for rectangular or other irregular or 3D shaped samples, a spray of etching cream instead of a dip may show better texture uniformity. In the spray method, the etching cream can be allowed to spray onto the substrate surface either manually or using a pump. In the spray method, the substrate may be put in a rack with 30 degree of tilt from a horizontal plane. The substrate can be sprayed homogeneously with the same flow rate. An anti-acid pump with a flow rate ranging from 20 L/min to 50 L/min may be used for spraying the etching cream onto the substrate surface. Larger glass surfaces may require a spray having a higher flow rate. Any size or shape of the glass may be applicable either using the spray method or dipping method.

EXAMPLES

Figure 2:
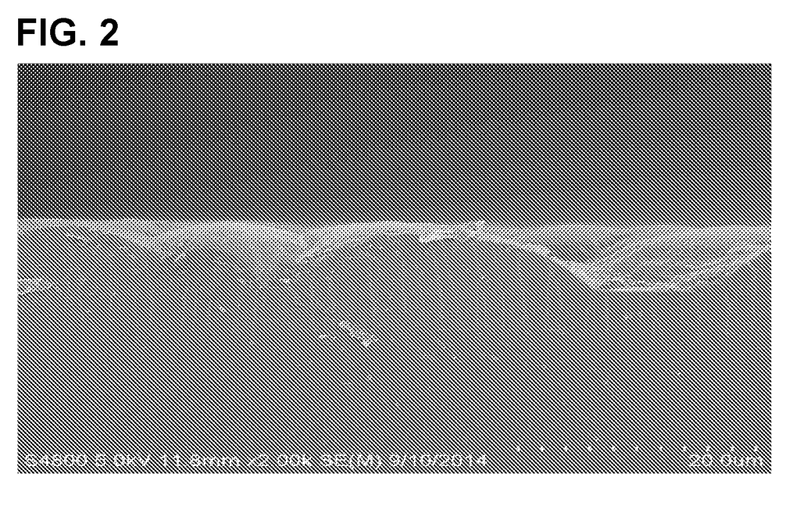
FIG. 2 is a scanning electron microscope image showing the surface morphology of a textured surface prepared by methods described herein. The length bar equates to 20 µm.

Pre-cleaned glass is laminated on one side with the anti-acid protection film. Then it is immersed into acid solution for pre-cleaning comprising 9 wt % of HF and 9 wt % HCl aqueous solution. After that, the glass is rinsed in deionized water for 10 s and quickly put into the etching cream for 2 m-10 m for surface treatment. The etching cream that is used to roughen the surface of glass is composed of 10-20 wt % $NH_4F$ and 10-20 wt % $NH_4HF_2$, 0-10 wt % $KNO_3$, 5-20 wt % $BaSO_4$ as filler, 1-10 wt % soluble starch, 0-5 wt % polyacrylamide, 1-25 wt % $CuCl_2$. To prepare the etching cream, the solid powder chemicals are first weighted and mixed in a plastic container, and then 10-40 wt % of deionized water is added into the container with manual agitation. After that, 5-20 wt % of concentrated HF acid (40%) solution is added slowly with manual agitation with a plastic stick. When all the HF acid is added, the manual agitation is continued until a fluid slurry is formed. Then this etching slurry is further agitated by mechanical agitator for another 2 hours or kept at 20-25° C. for 24 hours before use to reach the chemical equilibrium. After rinsing in alkaline solution for 10 s, the substrate is subjected to post-cleaning to remove the residuals on the glass surface, then thoroughly cleaned with deionized water and delaminated. A cross-section image of textured glass after the etching process is shown in FIG. 2 and FIG. 3 along with a top down view in FIG. 5. The typical surface roughness (Ra) of the textured glass is 0.2~0.6 μm. Finally, the textured glass is coated in sequence with indium tin oxide, an emitting layer and a metal layer to fabricate the OLED device as FIG. 6 showed. The feature size of fabricated substrate is measured under optical microscopy, and features are approximately 5-20 μm as showed in FIG. 3. The optical performance of textured substrates is measured by gloss meter, haze meter and roughness meter. Table 1 shows the measured attributes of those samples, the DOI (distinctness of image) is zero for all samples, which implies the very strong scattering of incident light.

Table 1, provided below, summarizes the surface texture attributes of glass generated by this process. Surface properties were determined using standard techniques including scanning electron microscopy (FIG. 3 and FIG. 4), Keyence Confocal Laser Scanning Microscopy (FIG. 5) Rhopoint gloss meter, BYK Haze meter and Mitutoyo SJ-310 roughness meter and an Nikon Eclipse L200N optical microscopy (1000×) (FIG. 3).

| Sample ID | Gloss 20° | Gloss 60° | Gloss 80° | DOI | Haze-R | Rspec | Trans (%) | Haze-Tx | Ra (μm) | Feature size (μm) |
|---|---|---|---|---|---|---|---|---|---|---|
| 1 | 0.3  | 9.77 | 40.64 | 0.00 | 0.46 | 0.07 | 75.7 | 95.8 | 0.48 | 9.24 |
| 2 | 0.31 | 9.75 | 38.14 | 0.00 | 0.48 | 0.07 | 76.2 | 96.2 | 0.50 | 9.04 |
| 3 | 0.31 | 9.75 | 40.91 | 0.00 | 0.45 | 0.07 | 75.9 | 96.0 | 0.46 | 9.10 |
| 4 | 0.31 | 9.66 | 41.21 | 0.00 | 0.43 | 0.07 | 76.3 | 95.7 | 0.47 | 9.15 |
| 5 | 0.31 | 9.88 | 39.24 | 0.00 | 0.46 | 0.07 | 76.4 | 96.1 | 0.48 | 9.48 | wherein DOI is the distinctness of image, Haze-R is the reflective haze, Rspec is the peak relectance, Trans is the percent transmittance, Haze-Tx is the transmitted haze, and Ra is the average roughness, and feature size is the average size of the surface elements on the roughened glass surface.

The textured glass is then moved used to fabricate a WOLED, which includes an ITO layer as anode, a hole injection layer (HIL), a hole transport layer (HTL), an emission layer (EL), an electron transport layer (ETL), an electron injection layer (EIL) and a metal layer (silver or aluminum) as cathode. Finally, an encapsulation glass issued for sealing the whole device. The external quantum efficiency of fabricated WOLED with untreated glass substrate and textured glass substrate were measured with the measurement system utilizing the integrating sphere as well as the I-V-L characteristics of device, chromaticity coordinate (CIEx, CIEy) in color space were also measure and showed in Table 2. The maximum angle integrated EQE reaches 68.5% in the case of textured glass compared with an average of 42% in the case of untreated glass, providing an effective quantum efficiency (EQE) improvement of 1.63 times.

TABLE 2

| | Current (J) | Voltage (V) | Luminance (cd/m²) | Luminous Efficiency (cd/A) | Color Space (CIEx) | Color Space (CIEy) | Luminous Efficiency (lm/W) | EQE | Angle integrated EQE |
|---|---|---|---|---|---|---|---|---|---|
| Glass | 1.8 | 8.8 | 2970 | 165.0 | 0.469 | 0.418 | 58.9 | 81.8 | 43.4% |
| | 2.0 | 8.3 | 2970 | 149.0 | 0.468 | 0.414 | 56.6 | 74.4 | 41.1% |
| | 2.1 | 8.3 | 3050 | 145.0 | 0.467 | 0.414 | 55.2 | 72.9 | 41.6% |
| Textured | 2.7 | 9.7 | 3050 | 113.0 | 0.468 | 0.416 | 36.7 | 56.4 | 48.3% |
| Glass | 1.8 | 9.3 | 2980 | 165.0 | 0.470 | 0.416 | 56.1 | 82.7 | 68.5% |
| | 1.8 | 9.2 | 3000 | 167.0 | 0.469 | 0.416 | 57.3 | 83.0 | 67.0% |

What is claimed is:

1. A device, comprising:
an article comprising a textured glass substrate comprising a first face, a second face, a thickness of 30 µm to 2 mm measured from the first face to the second face, and at least one edge;
the first face comprising an approximately planar surface comprising a first surface roughness, $R_{a1}$, of less than 2 nm; and
the second face comprising a textured surface comprising a second surface roughness, $R_{a2}$, of from 200 nm to 600 nm and a plurality of surface features comprising a feature size, F, of 2 µm to 20 µm in diameter;
a cathode;
an anode; and
at least one organic light emitting layer that is capable of emitting light,
wherein the textured glass substrate is coupled to the device such that light emitted from the organic light emitting layer passes through the textured glass substrate.

2. The device of claim 1, wherein the textured glass substrate comprises a reflective haze of 0.5 or lower as measured by ASTM D4039.

3. The device of claim 1, wherein the textured glass substrate comprises a haze in transmission of greater than 80% as measure by ASTM D1003.

4. The device of claim 1, wherein the first surface roughness, $R_{a1}$, is less than 1 nm.

5. The device of claim 1, wherein the second surface roughness, $R_{a2}$, is from 400 to 540 nm.

6. The device of claim 1, wherein the feature size, F, is 2 µm to 15 µm in diameter.

7. The device of claim 1, wherein the textured glass substrate provides an enhancement to light output from the organic light emitting layer of greater than 50% when compared to a second device identical to the device except that the second device substitutes a planar, non-textured glass substrate of identical composition and thickness in place of the textured glass substrate, wherein the planar, non-textured glass substrate comprises:
a first planar, non-textured face; a second planar, non-textured face; and at least one edge,
the first planar, non-textured face comprising a surface roughness of less than 2 nm, and
the second planar, non-textured face comprising a surface roughness of less than 2 nm.

8. The device of claim 1, wherein the plurality of surface features comprise a height of 2 µm to 8 µm.

9. The device of claim 1, wherein the textured surface faces away from the organic light emitting layer such that the light emitted from the organic light emitting layer passes through the approximately planar surface before passing through the textured surface.

10. The device of claim 1, wherein an external quantum efficiency of the device is 40% or greater.

11. The device of claim 10, wherein the external quantum efficiency of the device is 60% or greater.

* * * * *